United States Patent [19]

Ozawa

[11] Patent Number: 5,625,941
[45] Date of Patent: May 6, 1997

[54] APPARATUS FOR CONVEYING AND MOUNTING ELECTRONIC PARTS

[75] Inventor: Kazushige Ozawa, Shizuoka, Japan

[73] Assignee: Tenryu Technics Co., Ltd., Shizuoka, Japan

[21] Appl. No.: 441,404

[22] Filed: May 15, 1995

[30] Foreign Application Priority Data

May 24, 1994 [JP] Japan .................................. 6-110056

[51] Int. Cl.⁶ .................................................. H05K 3/30
[52] U.S. Cl. ..................................... 29/740; 29/759
[58] Field of Search ........................... 29/740, 741, 759, 29/739, 784; 198/803.7

[56] References Cited

U.S. PATENT DOCUMENTS

| | | | |
|---|---|---|---|
| 4,438,559 | 3/1984 | Asai et al. | 29/740 |
| 4,459,743 | 7/1984 | Watanabe et al. | 29/740 |
| 4,520,557 | 6/1985 | Harigane et al. | 29/759 X |
| 4,619,043 | 10/1986 | Takahashi et al. | 198/803.7 X |
| 5,295,294 | 3/1994 | Ito | 29/759 X |

FOREIGN PATENT DOCUMENTS

| | | | |
|---|---|---|---|
| 3126300 | 5/1991 | Japan | 29/740 |
| 3159200 | 7/1991 | Japan | 29/740 |
| 3160794 | 7/1991 | Japan | 29/740 |
| 5-235587 | 9/1993 | Japan | 29/740 |

*Primary Examiner*—Peter Vo
*Attorney, Agent, or Firm*—McCormick, Paulding & Huber

[57] ABSTRACT

An apparatus for conveying and mounting electronic parts is disclosed, wherein the electronic parts such as semiconductors are mounted onto a printed board (1). A plurality of pallets (6) having trays (5) thereon, said trays (5) receiving a multitude of electronic parts therein respectively, are supported in a state where the trays (5) are superposed on shelf members (35 and 36) provided on a vertical motion frame (34), and the vertical motion frame (34) is vertically movable. The printed board (1) is conveyed to a predetermined part mounting position by belt conveyors (2 and 3). A pallet moving member (15) engaging any one of the pallets (6) is laterally moved with respect to the belt conveyors (2 and 3) between a mounting position where the pallet moving member (15) overlaps the belt conveyors (2 and 3) and a retracted position for returning to the vertical motion frame (34) having the shelf members (35 and 36). Any one of the plurality of pallets (6) is positioned by vertically moving the moving frame (34) driven by a driving member. The electronic parts on the pallet (6) are mounted onto the printed board (1) by a mounter head (45) of a mounter.

4 Claims, 4 Drawing Sheets

APPARATUS FOR CONVEYING AND MOUNTING ELECTRONIC PARTS

BACKGROUND OF THE INVENTION

1. Field of the Invention

This invention relates to an apparatus for conveying and mounting electronic parts, wherein the electronic parts are conveyed to the vicinity of a printed board and mounted thereonto.

2. Related Art Statement

An automatic mounting apparatus for mounting electronic parts, such as semiconductor chips enclosed in a package, onto a printed board is called a chip mounter, and the mounting apparatus comprises: conveyors for conveying a printed board; a part supply device for conveying the electronic parts to be mounted onto the printed board; and a mounter, i.e., a mounting machine having a mounting head for mounting the electronic parts onto the printed board. In the part supply device, a various type of means are previously provided adjacent to the conveyors, said means supplying the electronic parts in association with their forms, dimensions and packing styles, and said means also mounting or removing the electronic parts according to the need.

As another type of part supply device for conveying small-sized electronic parts, such a type of device is known that the electronic parts which are previously packed for supplying purpose are loaded into the device with keeping the packing style (as the general packing style used in the device, the electronic parts are pasted or sealed by a tape on paper or synthetic resin tapes, or the electronic parts are inserted into synthetic resin tubes). In this device, the electronic parts are successively taken out of the package at the loaded position and are conveyed to a predetermined mounting position for delivering them to the mounting head of the mounter, and the parts are held at the mounting position. The held electronic parts at the predetermined mounting position are taken up by the mounting head of the mounter by a preferable method, such as vacuum sucking, and they are conveyed to a printed board and mounted thereon.

The packing styles of the small-sized electronic parts are generally described as above. However, large-sized parts such as QFP (Quad Flat Package) are often contained in a tray and conveyed to a predetermined position apart from the above-described method. Furthermore, it is difficult to convey and supply some kind of electronic parts, such as so-called bare chips, without using a tray in view of the nature or the manufacturing process of the parts. Combined with the improvements in the mounting technique due to the image processing in recent years in particular, the method of conveying and supplying the parts by use of trays has enhanced its importance.

The inventor of the present invention has examined techniques of conveying the electronic parts by use of trays. The following is the techniques examined by the inventor, and the outlines thereof will be described as below.

That is, there are the following three methods as ones for conveying and supplying the parts, which have heretofore been thought of. A first method has such arrangements that, for example, as disclosed in the Japanese Patent Laid-Open No. 5-235587 (corresponding to the U.S. Pat. No. 5,295,294), one or a plurality of trays are provided at the outside of the movable area of the mounting head of the mounter, and that such a means (so-called "pick and place" means) is provided for successively taking out a predetermined electronic parts from a tray and placing those parts on a transferring means (such as a shuttle for transferring the parts from a position close to the tray into movable area of the mounting head). In this case, the electronic parts transferred to the mounting position are mounted onto the printed board by the mounting head of the mounter.

In this method, there are such advantages that the number of trays is not limited and that supply and exchange of the trays can be made even during the operation of the mounter. On the other hand, there are such disadvantages in the method that it is necessary to provide mechanisms such as a means for controlling "pick and place", the shuttle means, and a means for selecting desirable electronic parts from a plurality of trays, in which the mechanisms become complicated, the cost of the whole apparatus is increased and a considerable space is required, and so forth. Therefore, in the case where many types of the electronic parts (a number of trays) are not particularly required, this method is often regarded as being not most suitable one. Furthermore, there is also such a disadvantage in that method that the mounting speed is generally limited in accordance with the conveying capacity (speed) of the shuttle when the same parts are continuously mounted.

The following method is considered as a second method in which a tray is provided in the movable area of the mounting head of the mounter, keeping the tray away from a conveying region of the printed board, and a predetermined electronic parts are directly taken up by a preferable means, such as a mounting head, and then mounted onto the printed board.

Although it is necessary to provide on the side of the mounter a controlling element for successively taking up the electronic parts in a lattice arrangement in this method, the method has a very simple construction, so that the method is often used in the case where it is not necessary to simultaneously supply a multiple type of the electronic parts. However, in the movable area of the mounting head in the mounter, the dimensions of the conveying direction of the printed board are generally determined by the width of the arrangement of the part supply device. Further, the dimensions in a direction perpendicularly intersecting the conveying direction of the printed board (generally, in the axial direction) are designed in accordance with the largest dimensions of the printed board mountable onto the mounter (generally, the largest conveying width), so that, normally, no space is remained in the mounter other than the above in view of the movable area of the mounting head. Accordingly, when the electronic parts are mounted onto the printed board having the largest dimensions, this method cannot be used because there is no space for providing the tray.

In order to apply this method effectively, such a condition is required that the width of the printed board with the electronic parts mounted thereon is satisfactorily small with respect to the largest width of the mounter. As the width of the printed board becomes larger, the number and the dimensions of the trays to be provided are limited. Furthermore, with this method, it is inevitably impossible to perform works for supplying or exchanging the trays or the electronic parts during the operation of the mounter.

As a third method, there is a method in which a plurality of trays are normally loaded in the vicinity of the movable area of the mounting head provided in the mounter. In this case, one tray is selected out of a plurality of trays, transferred into the movable area of the mounting head, and positioned. Similarly to the second method, the electronic parts are directly mounted onto the printed board in this method without using a transferring means like a shuttle.

This method is intended to obviate the problem of the difficulties in supplying the electronic parts and exchanging their types during the operation, said problem being the weak point of the second method. However, inconsistence between the dimensions of the printed board and the dimensions of the tray cannot be obviated because a scope within which the tray transferred from the loaded position is transferred to a predetermined mounting position is same as one in the second method. Accordingly, similarly to the second method, this method is effective under the specific manufacturing situation, however, this method greatly lacks the possibility of accommodation for the situation which is not easily specified, i.e., a future production.

As described above, the above three methods are thought of at present. However, the respective methods has advantages and disadvantages, and it is difficult to select the apparatus for supplying and conveying the electronic parts, which can make the capacity of the mounter to be achieved to the utmost.

SUMMARY OF THE INVENTION

It is an object of the present invention to achieve the effective mounting of electronic parts onto any size of a printed board.

An apparatus for conveying and mounting the electronic parts according to the present invention comprises: a conveying means for conveying the printed board; a pallet supporting means for slidably supporting opposite side portions of a pallet mounted thereon with a multitude of electronic parts; and a pallet moving member horizontally reciprocating the pallet between a mounting position upwardly of the conveying means and a retracted position retracted from this mounting position, whereby the electronic parts received onto the pallet delivered to the mounting position by the pallet moving member are mounted onto the printed board.

Furthermore, the apparatus for conveying and mounting the electronic parts according to present invention comprises: the conveying means for conveying the printed board; the pallet supporting means for slidably supporting the opposite side portions of a plurality of pallets mounted thereon with a multitude of electronic parts, respectively; a pallet moving member for engaging any one of the plurality of pallets and for horizontally reciprocating the engaged pallet between the mounting position upwardly of the conveying means and the retracted position retarded from this mounting position; and a pallet vertically moving means for vertically moving the pallet supporting means and for positioning any one of the plurality of pallets supported by the pallet supporting means at the position where the pallet is engaged with the pallet moving member; whereby the electronic parts mounted on the pallet delivered to the mounting position by the pallet moving member are mounted onto the printed board. The operation of mounting the electronic parts onto the printed board is performed by the mounting head.

A moving means may be provided on a part supply assembly having the pallet supporting means and the pallet moving member, whereby the part supply assembly may be moved to a desirable position of the printed board conveying means.

According to the apparatus for conveying and mounting the electronic parts having the above-described construction, the pallet can be conveyed to the mounting position where the pallet is upwardly shifted through a space with respect to the printed board conveying means, whereby the print board and the pallet are shifted vertically from each other so as not to interfere with each other. Accordingly, the electronic parts can be mounted onto the printed board in a state where the pallet is brought into a position closest to the printed board conveying means, thus improving the mounting efficiency greatly.

The pallets can be supported at a plurality of stages, whereby a multiple type of the electronic parts can be received in the pallet support means, thus improving the mounting efficiency.

While the electronic parts are mounted onto the printed board from the tray on the pallet, another pallet with the electronic parts received thereon can be loaded into the pallet support means, thereby enabling to improve the working hour of the apparatus for conveying and mounting.

Further, the pallets can be conveyed into the movable area in the vicinity of the mounting head, whereby there is no need for moving the mounting head over a long stroke, so that the mounting efficiency can be improved.

The part supply assembly can be moved, so that mounting works of the electronic parts can be performed at a desirable position of the conveying means.

The above-described and other objects, and novel feature of the present invention will become apparent more fully from the description of the following specification in conjunction with the accompanying drawings.

DESCRIPTION OF THE PREFERRED EMBODIMENT

Figure 1:
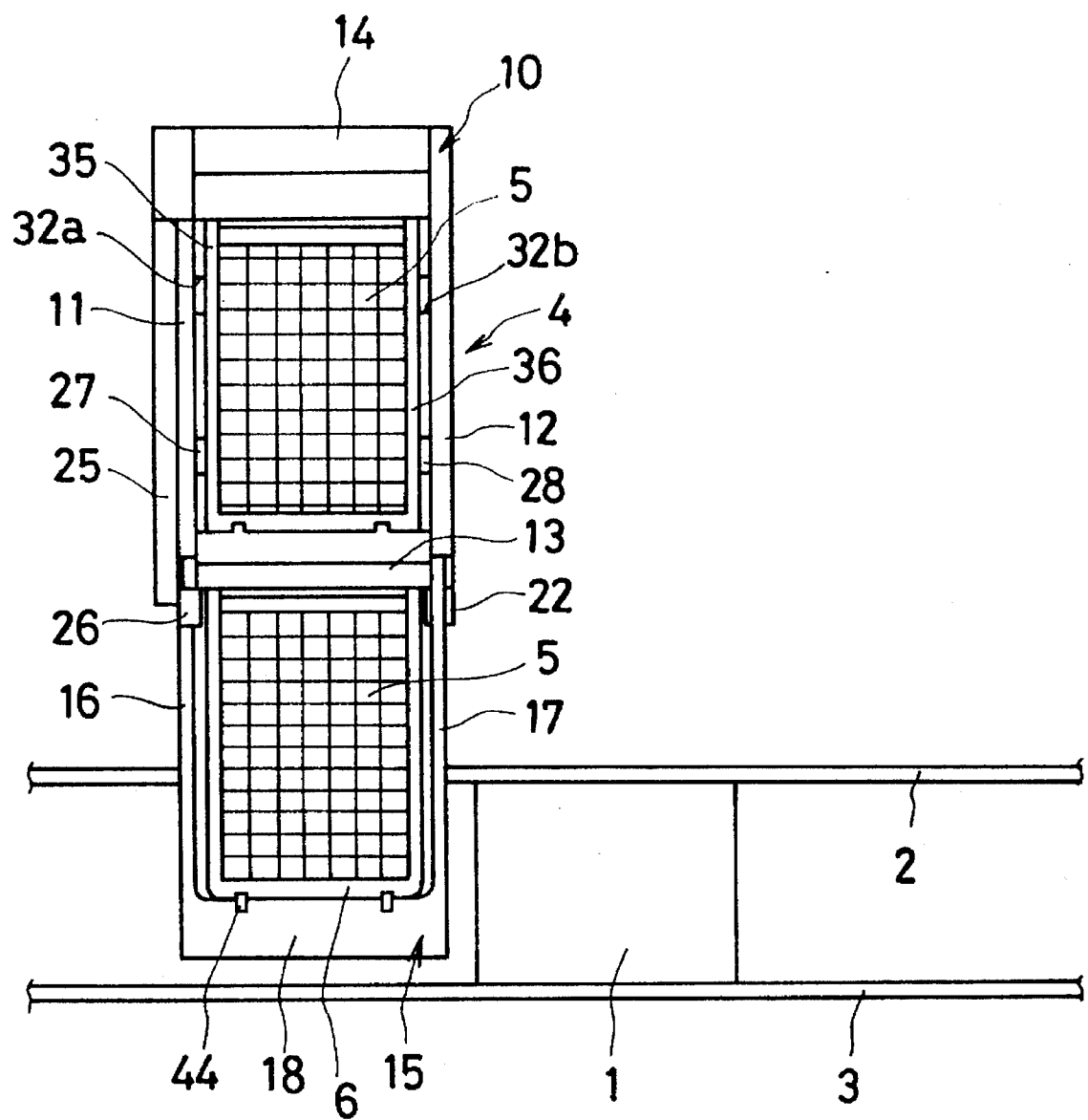
FIG. 1 is a plan view showing an embodiment of the apparatus for conveying and mounting the electronic parts according to the present invention.

As shown in FIG. 1, an apparatus for conveying and mounting has belt conveyors 2 and 3 for conveying a printed board 1 to a predetermined position at which electronic parts are mounted on the printed board 1. FIG. 1 shows a state where the printed board 1 is positioned at a part mounting position by the belt conveyors 2 and 3.

Figure 2:
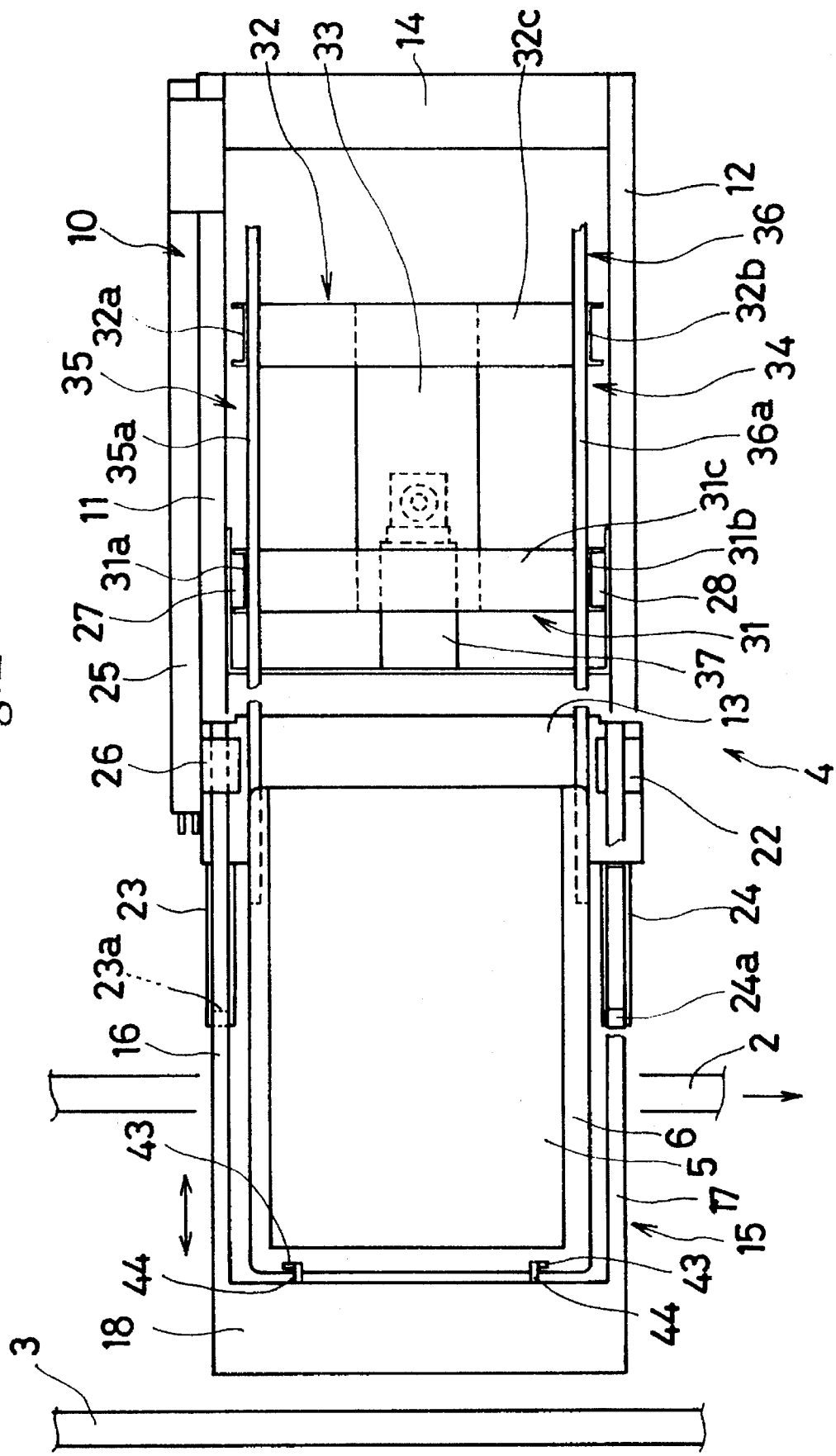
FIG. 2 is an enlarged plan view of the part supply assembly shown in FIG. 1.

A part supply assembly 4 is provided at a position adjacent to the belt conveyor 2, said part supply assembly 4 supplying the electronic parts to be mounted onto the printed board 1. The part supply assembly 4 has a support frame member 10. As shown in FIG. 2, the support frame member 10 comprises: two support beam members 11 and 12 provided in parallel to each other; a base portion 13 integrated with the forward end portion of the support beam members 11 and 12; and a connecting member 14 integrated with the rear end portion of the support beam members 11 and 12.

Figure 4:
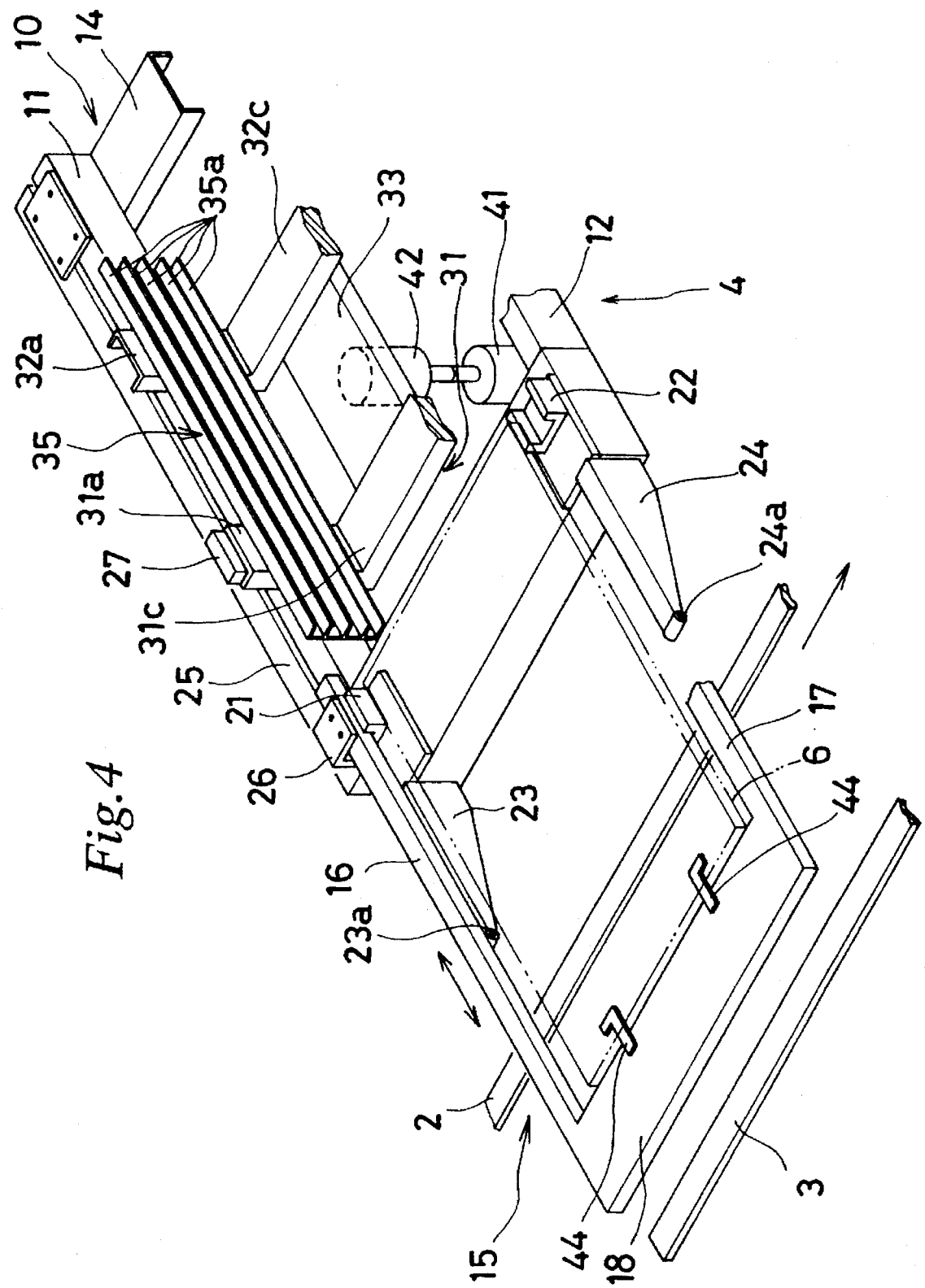
FIG. 4 is a partially omitted oblique view showing the part supply assembly.

As shown in FIGS. 2 and 4, a pallet moving member 15 has: sliding portions 16 and 17 which are provided in parallel to the support beam members 11 and 12 respectively; and a forward end portion 18 integrally formed with these sliding portions 16 and 17, so that the sliding portions 16, 17 and the forward end portion 18 form a U-shaped frame in a plan view. In this pallet moving member 15, the sliding portions 16 and 17 are guided by guide members 21 and 22 which are fixed to the base portion 13 and arranged to slide the sliding portions 16 and 17 in the horizontal direction. In order to support undersurfaces of the respective sliding portions 16 and 17, brackets 23 and 24 are provided on the base portion 13, said brackets 23 and 24 having rollers 23a and 24a.

As shown in FIGS. 2 and 4, this pallet moving member 15 is arranged to be movable in a horizontal direction, substantially perpendicular to the conveying directions of the belt conveyors 2 and 3. The pallet moving member 15 is reciprocated between a mounting position and a retracted position; said mounting position is the position where the pallet moving member 15 is pushed out to and overlaps the belt conveyors 2 and 3 with an upward space; and said retracted position is the position where the pallet moving member 15 is retracted to from the mounting position. In order to drive this pallet moving member 15 in the horizontal direction, a rodless cylinder 25 is fixed to the support beam member 11, and a slider 26 is provided on this rodless cylinder 25 and connected to the sliding portion 16. In place of this rodless cylinder 25, another type of pneumatic actuators or an electric motor may be used to drive the pallet moving members 15.

Guide supports 27 and 28 are vertically fixed to the support beam members 11 and 12. Vertical portions 31a and 31b are provided along with the respective guide supports 27 and 28, said vertical portions 31a and 31b having U-shaped corss-section respectively and being arranged to slide vertically. A horizontal connecting portion 31c is provided to connect the vertical portions 31a and 31b to each other. The vertical portions 31a and 31 and the horizontal connecting portion 31c form a first support member 31. Similarly to this first support member 31, a second support member 32 is formed of vertical portions 32a, 32b and a horizontal connecting portion 32c for connecting these vertical portions to each other. These support members 31 and 32 are connected to each other by a horizontal member 33, so as to form a vertical motion frame 34, said vertical motion frame 34 constructing a tray support means.

A shelf member 35 is secured to the vertical portions 31a and 32a of the vertical motion frame 34, said shelf member 35 having a number of guide rails 35a for slidably supporting a side portion of a pallet 6 on which a tray 5 for receiving a multitude of electronic parts is mounted. On the other hand, a shelf member 36 having the corresponding number of guide rails 36a is secured to the vertical portions 31b and 32b of the vertical motion frame 34 in opposite to the shelf member 35, so as to slidably support another side portion of the pallet 6. In the illustration, the shelf members 35 and 36 support four pallets 6, said respective pallets 6 having the tray 5 thereon in which a multitude of electronic parts are to be received respectively. By receiving the pallets 6 at many stages in the vertical motion frame 34, a number of types of the mounted electronic parts can be increased. The number of the supported pallets may be set desirably. As shown in FIG. 1, lattice-shaped raising portions are formed in the tray 5 placed on the pallet 6, said raising portions forming a multitude of rectangular recessed portions, in which the electronic parts, not shown, are received. Incidentally, the electronic parts may be directly received in the pallet 6 without using the tray 5.

The vertical motion frame 34 is arranged to move vertically, so as to select one of the pallets 6 out of four in this embodiment, said pallets 6 being supported at the respective opposite side portions by the shelf members 35 and 36, and to be able to make positioning of a desirable pallet 6 in the pallet moving member 15. In order to vertically drive the vertical motion frame 34, a driving member 40 is secured between a horizontal member 33 and a bracket 38, said bracket 38 being secured to the support frame member 10 through a support member 37. This driving member 40 consists of two pneumatic cylinders 41 and 42. Forward ends of rods 41a and 42a having linear strokes different from each other are abutted the respective pneumatic cylinders 41 and 42. Incidentally, as the driving member 40, other driving means such as an electric motor other than the pneumatic cylinders may be used.

Figure 3:
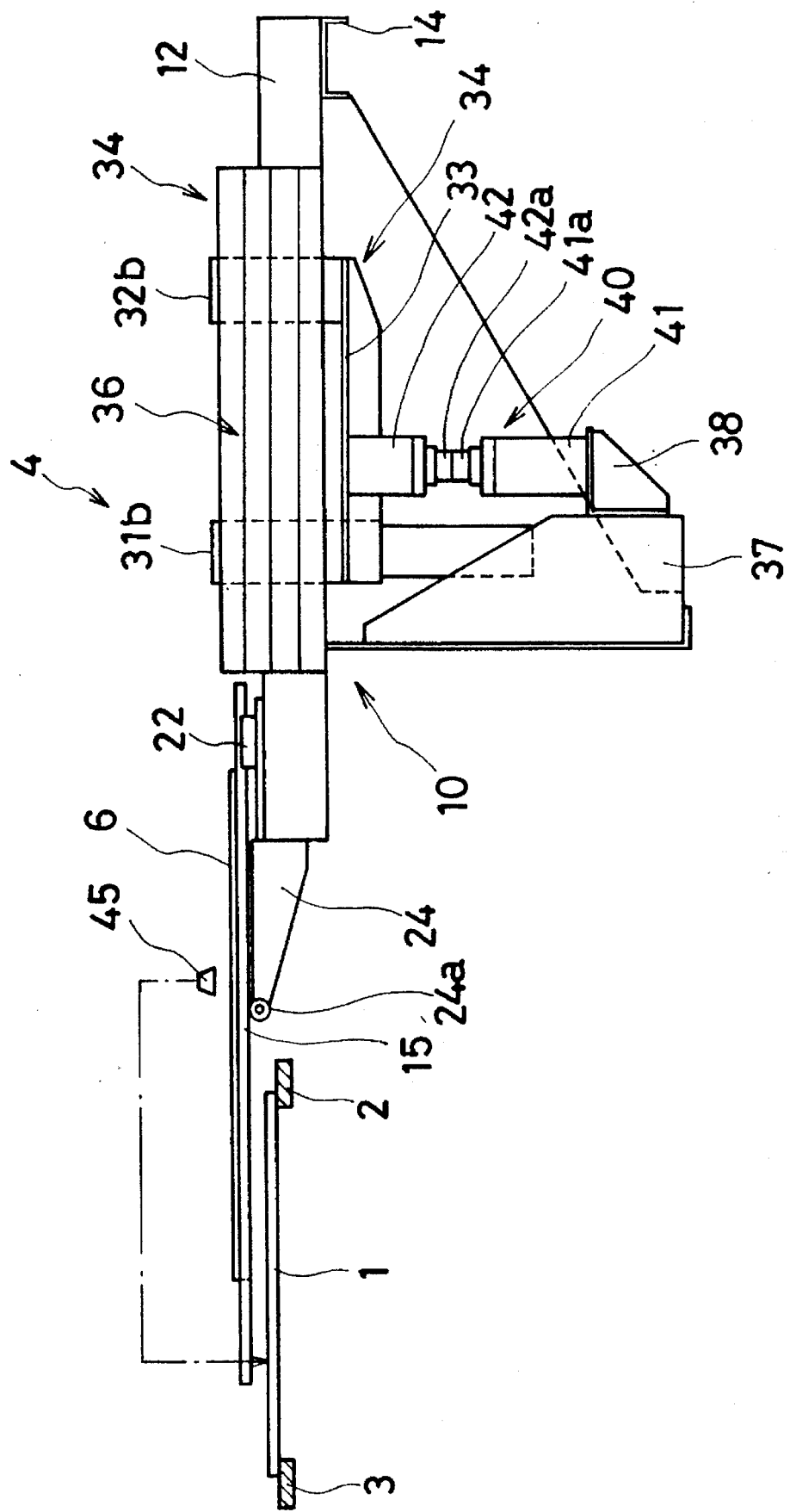
FIG. 3 is a front view of FIG. 2.

FIG. 3 shows a state where the vertical position of the vertical motion frame 34 is set so as to make portion of the highest stage of the shelf members 35 and 36 to correspond with the vertical level of the pallet moving member 15. In this state, when the rodless cylinder 25 is driven to retract the pallet moving member 15 to the retracted position, the forward end portion 18 of the pallet moving member 15 approaches the forward end portion of the pallet 6 at the highest stage of the pallet 6 out of four pallets received in the shelf members 35 and 36. During this retracting movement of the pallet moving member 15, the sliding portions 16 and 17 move along with the support beam members 11 and 12 at the outside of the shelf members 35 and 36.

The forward end portion 18 of the pallet moving member 15 has a engageable member 44 which is engageable with an engageable groove 43 provided in the forward end portion of the pallet 6. Accordingly, when the pallet moving member 15 is moved forwardly from the retracted position to the mounting position in a state where the engageable member 44 is engaged with the engageable groove 43, one of the four pallets 6 is conveyed to the mounting position as shown in FIG. 2.

In order to mount, in this state, the electronic parts received in the tray 5 on the pallet 6 onto the printed board 1 which has been conveyed to the parts mounting position by the belt conveyors 2 and 3, a mounting head 45 is provided as shown in FIG. 3.

Description will be given of the procedures of mounting the electronic parts onto the printed board 1 by use of the above-described apparatus. For example as shown in FIG. 3, the printed board 1 is conveyed from left to right by the belt conveyors 2 and 3, and positioned at the parts mounting position as shown.

In the illustration, the electronic parts to be mounted onto the printed board 1 are received in the four pallets 6 respectively, and a specified pallet 6 out of these four pallets is delivered from the shelf members 35 and 36 by the pallet moving member 15 and then conveyed to the mounting position as shown.

In this state, the electronic parts received in the tray 5 on the pallet 6 are mounted onto the printed board 1 by the mounting head 45. When all of the electronic parts are removed from the pallet 6, the pallet moving member 15 is returned to the retracted position and the vacant pallet 6 is supported by the shelf member 36. Subsequently, the vertical motion frame 34 is driven, and another pallet 6 is vertically moved to the same vertical level as one of the pallet moving member 15, so that the pallet 6 can be transferred to the mounting position by the pallet moving member 15. Even if the vertical motion frame 34 is moved vertically in the state where the pallet moving member 15 is located at the retracted position, the engageable member 44 provided in the pallet moving member 15 is constructed not to interfere with the pallet 6 at the engageable groove 43.

The vacant pallet 6, i.e., the pallet 6 in the state where all of the electronic parts 6 are mounted, is taken out from the rear side of the vertical motion frame 34, i.e., from above as in FIG. 1, and a new pallet 6 is conveyed in the frame 34. Accordingly, during the operation of the mounter which is mounting the electronic parts on the pallet 6 positioned at the mounting position onto the printed board by the use of the mounting head 45, a new pallet 6 can be loaded into the vertical motion frame 34, so that the working hour of the apparatus can be improved.

As shown in the Figures, by use of the pallet moving member 15 according to the present invention, the pallet 6 is moved to the mounting position lateral to the belt conveyors 2 and 3 as being the printed board conveying means, making a space upwardly between the pallet 6 and the belt conveyors 2 and 3. Therefore, the electronic parts can be mounted onto the printed boards having various sizes, without limiting the size of the printed board 1 to be conveyed, as compared with the case where the pallet 6 is set at a substantially equal level of the belt conveyors 2 and 3, being in parallel and adjacent to the conveyors 2 and 3.

In the illustration, such an arrangement has been adopted that a plurality of pallets 6 are supported by the shelf members 35 and 36, and that the vertical motion frame 34 is moved vertically so as to make positioning of any one of the pallets 6 up to the same vertical position as one of the pallet moving member 15. However, one pallet 6 may be supported by the shelf members 35 and 36. In that case, it is not necessary to vertically move the shelf members 35 and 36.

Furthermore, such an arrangement may be adopted that a moving means such as wheels may be provided in the support frame member 10, so that the part supply assembly 4 itself shown in FIGS. 2 to 4 can be moved to a desirable position of the belt conveyor 2 and 3.

Detailed description has hereinabove been given of the invention achieved by the present inventor with reference to the embodiment. However, the present invention should not be limited to the embodiment described above, and may be variously modified within the scope not departing from the gist.

What is claimed is:

1. An apparatus for conveying and mounting electronic parts, wherein the electronic parts are conveyed to a printed board and mounted thereonto, said apparatus comprising:

a conveying means for conveying said printed board;

a pallet support means for slidably supporting opposite side portions of a plurality of pallets, said pallets having a multitude of electronic parts thereon respectively;

a pallet moving member for engaging any one of said pallets and for horizontally reciprocating said engaged pallet between a mounting position above said conveying means and a retracted position retracted from said mounting position; and a pallet vertically moving means for vertically moving said pallet support means and for positioning any one of said pallets supported by said pallet support means at a position where said any one of pallets is engaged with said pallet moving member;

whereby the electronic parts placed on said pallet are delivered to said mounting position by said pallet moving member and mounted onto said printed board.

2. An apparatus for conveying and mounting electronic parts, wherein the electronic parts are conveyed to a printed board and mounted thereonto, said apparatus comprising:

a conveying means for conveying said printed board and for positioning said printed board at a part mounting position;

a pallet support means for slidably supporting opposite side portions of a plurality of pallets, said pallets having a multitude of electronic parts thereon respectively;

a pallet moving member for engaging any one of said pallets and for horizontally reciprocating said engaged pallet between a mounting position above said conveying means and a retracted position retracted from said mounting position;

a pallet vertically moving means for vertically moving said pallet support means and for positioning any one of said pallets supported by said pallet support means at a position where said any one of pallets is engaged with said pallet moving member; and a mounting means for mounting the electronic parts placed on the pallet onto said printed board, said pallet being delivered to said mounting position by said pallet moving member.

3. The apparatus for conveying and mounting electronic parts as set forth in claim 3, comprising a moving means provided in a part supply assembly comprising said pallet support means and said pallet moving member, whereby said part supply assembly can be moved to a desirable position of said printed board conveying means.

4. An apparatus for conveying and mounting electronic parts, wherein the electronic parts are conveyed to a printed board and mounted thereonto, said apparatus comprising:

a conveying means for conveying said printed board;

a pallet support means for slidably supporting opposite side portions of a pallet, said pallet having a multitude of electronic parts thereon; and a pallet moving member for horizontally reciprocating said pallet toward the perpendicular direction to the conveying direction of said printed board between a mounting position above said conveying means and a retracted position retracted from said mounting position;

whereby said pallet is moved from said pallet support means at said retracted position and is delivered to said mounting position by said pallet moving member, and the electronic parts on said pallet are mounted onto said printed board at said mounting position.

* * * * *